United States Patent

Tepman et al.

[11] Patent Number: 5,226,632
[45] Date of Patent: Jul. 13, 1993

[54] SLIT VALVE APPARATUS AND METHOD

[75] Inventors: Avi Tepman, Cupertino; Dana L. Andrews, Mountain View, both of Calif.

[73] Assignee: Applied Materials, Inc., Santa Clara, Calif.

[21] Appl. No.: 866,961

[22] Filed: Apr. 10, 1992

Related U.S. Application Data

[63] Continuation of Ser. No. 511,658, Apr. 20, 1990, abandoned.

[51] Int. Cl.$^5$ ............................................. F16K 31/44
[52] U.S. Cl. .................................... 251/335.3; 137/315
[58] Field of Search ............... 251/335.3, 335.1, 62, 251/87, 193, 63.5, 63.4; 137/527.4, 315

[56] References Cited

U.S. PATENT DOCUMENTS

| | | | |
|---|---|---|---|
| 2,924,233 | 2/1960 | Michaels | 137/315 |
| 4,270,727 | 6/1981 | Norman | 251/63.4 |
| 4,421,298 | 12/1983 | Kujawski | 251/368 |
| 4,515,344 | 5/1985 | Gemignani | 251/63.5 |
| 4,721,282 | 1/1988 | Shawver et al. | 251/62 |
| 4,869,458 | 9/1989 | Susini et al. | 251/14 |

Primary Examiner—Martin P. Schwadron
Assistant Examiner—Kevin L. Lee
Attorney, Agent, or Firm—Paul L. Hickman

[57] ABSTRACT

A slit valve apparatus associated with an aperture in a chamber wall through which a semiconductor wafer may be passed along a transfer plane. The apparatus is characterized by a valve seat which is angled relative to the transfer plane and a door which moves linearly along an axis substantially perpendicular to the valve seat. All frictionally engaged parts of the slit valve assembly are isolated from the interior of the chamber by a bellow sleeve to reduce the formation of particles. The method is characterized by the steps of surrounding the aperture with a first seating surface defining a sealing plane which is angularly disposed with respect to the transfer plane and engaging or disengaging a second seating surface with the first seating surface by linearly moving the second seating surface in a direction perpendicular to the sealing plane.

21 Claims, 2 Drawing Sheets

SLIT VALVE APPARATUS AND METHOD

This is a continuation of copending application(s) Ser. No. 07/511,658 filed on Apr. 20, 1990, now abandoned.

BACKGROUND OF THE INVENTION

This invention relates generally to slit valve assemblies and methods and more particularly to slit valve assemblies and methods used in semiconductor manufacturing equipment.

Semiconductor manufacturing equipment often include a number of adjacent but independently sealable chambers. For example, a single piece of semiconductor manufacturing equipment might include a number of processing chambers and one or more load-lock chambers clustered around a central robotic transfer chamber. To pass a semiconductor wafer between chambers elongated apertures or "slits" are provided in the walls between the chambers. These apertures can be selectively opened or closed by means of slit valves.

There are a great many types of slit valves known in the prior art. For example, in U.S. Pat. No. 4,785,962 of *Toshima* a vacuum chamber slit valve is disclosed which includes a door pivotally mounted near an aperture and pneumatically actuated cam follower rollers which selectively pivot the door between an open and closed position. Another approach is taken by *Hutchinson* in U.S. Pat. No. 4,715,764 who teaches a gate valve having an angularly disposed seat portion and a mating angular closure portion which moves vertically towards the seat portion. A third approach is disclosed in *Vacuum Valves 90*, May 1, 1989, pp. 24-29, a product catalog of VAT, Inc. VAT, Inc. provides a rectangular valve having a stepped seat which is engaged by a mating gate which moves perpendicularly with respect to the aperture.

There are several problems with gate valves of the prior art. Firstly, they all include bearing surfaces within the chamber which can generate particulates by surface-to-surface friction. Secondly, the force required to hold the gate valves in their closed position tends to be relatively large because the closing force is always at an angle to the seat surface. In consequence, considerable force must be applied to the doors of prior art slit valves to properly seal them against their valve seats.

SUMMARY OF THE INVENTION

It is therefore an object of this invention to provide a gate valve assembly which requires less sealing force than prior art gate valve assemblies and which does not have any particulate producing friction surfaces within the chamber with which it is associated.

The apparatus of the present invention includes a chamber wall defining an aperture through which integrated circuit wafers may be passed along a transfer plane. The slit valve assembly further includes a seat surrounding the aperture and having a first seating surface defining a seating plane which is angularly disposed with respect to the transfer plane and a door having a second seating surface matingly engageable with the first seating surface. Finally, the slit valve assembly includes a linear actuator mechanism for linearly moving the door towards and away from the seat along an actuator axis substantially perpendicular to the seating plane. The frictionally engaged portions of the linear actuator mechanism are enclosed within an expansible bellow sleeve to isolate all frictionally engaged surfaces from the interior of the chamber.

The method of the present invention involves surrounding an elongated aperture with a first sealing surface defining a sealing plane which is angularly disposed with respect to a transfer plane extending through said aperture and engaging or disengaging a second seating surface with the first seating surface by linearly moving the second seating surface in a direction substantially perpendicular to the sealing plane. The orientation of the first seating surface and the second seating surface is adjusted by deactivating a locking mechanism which locks the position of the second seating surface, engaging the first and second seating surfaces, and then reactivating the locking mechanism.

An advantage of the present invention is that the opening and closing motion of the door is linear and perpendicular to the valve seat. Since the all of the force applied to the door is normal to the seating surfaces less pressure needs to be applied to the door to provide an effective seal.

Another advantage of the present invention is that all frictional surfaces are isolated from the interior of the chamber by the bellow sleeve. This dramatically reduces particulate formation which can increase the yield of wafers processed within the semiconductor manufacturing equipment.

These and other advantages of the present invention will become clear to those skilled in the art upon a study of the detailed description of the invention and of the several figures of the drawings.

DETAILED DESCRIPTION OF THE PREFERRED EMBODIMENTS

Figure 1:
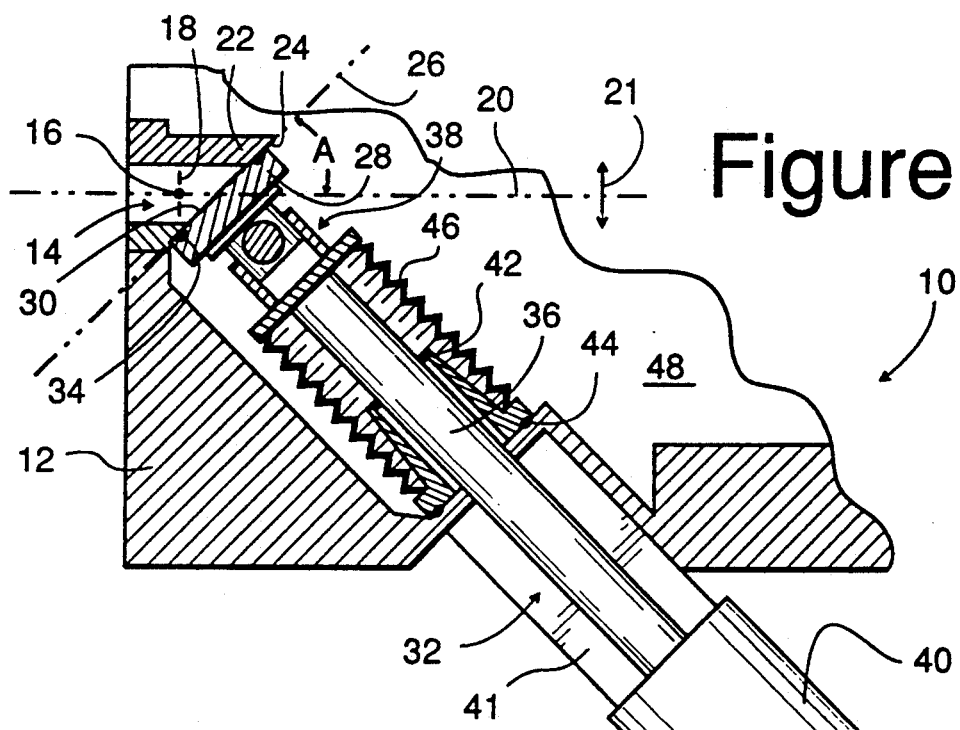
FIG. 1 is a partial cross-sectional elevatational view of a slit valve apparatus in accordance with the present invention with the slit valve in a closed position.

In FIG. 1, a slit valve apparatus 10 in accordance with the present invention includes a chamber wall 12 provided with an aperture 14 having a major axis 16 perpendicular to the plane of the paper and having a minor axis 18. The aperture 14 is adapted to pass an object, such as an integrated circuit wafer, substantially parallel to a transfer plane 20 which is parallel to the major axis 16 and perpendicular to the minor axis 18. As suggested by the arrow 21, the object can also be moved through aperture 14 along any plane parallel to transfer plane 20 or close to parallel to transfer plane 20. A seat 22 includes a first seating surface 24 which defines a sealing plane 26 which is angularly disposed with respect to the transfer plane 20. A door 28 has a second seating surface 30 which is matingly engageable with the first seating surface 24 along sealing plane 26. The door 28 is coupled to a linear actuator mechanism 32. An O-ring seal 34 is provided on door 28 to provide effective sealing between the door 28 and the seat 22.

The linear actuator mechanism 32 includes an elongated shaft 36, an adjustment mechanism 38 coupling a first end of the shaft 36 to door 28 and a reciprocal linear drive mechanism 40 coupled to a second end of shaft 36. The mechanism 40 is rigidly coupled to the wall 12 by a bracket 41. A shaft guide 42 is coupled to wall 12 and an O-ring 44 is provided to seal the shaft guide 42 to the wall. An expansible bellow sleeve 46 is sealed at one end to the adjustment mechanism 38 and at the other end to shaft guide 42. As such, the sliding frictional engagement between shaft 36 and the shaft guide 42 is isolated from the interior 48 of the chamber. The linear drive mechanism is preferably a commercially available pneumatic actuator which causes the shaft 36 to move away from the mechanism 40 when air pressure is applied to a first inlet 50 and towards the mechanism 40 when air pressure is applied to a second inlet 52.

Figure 2:
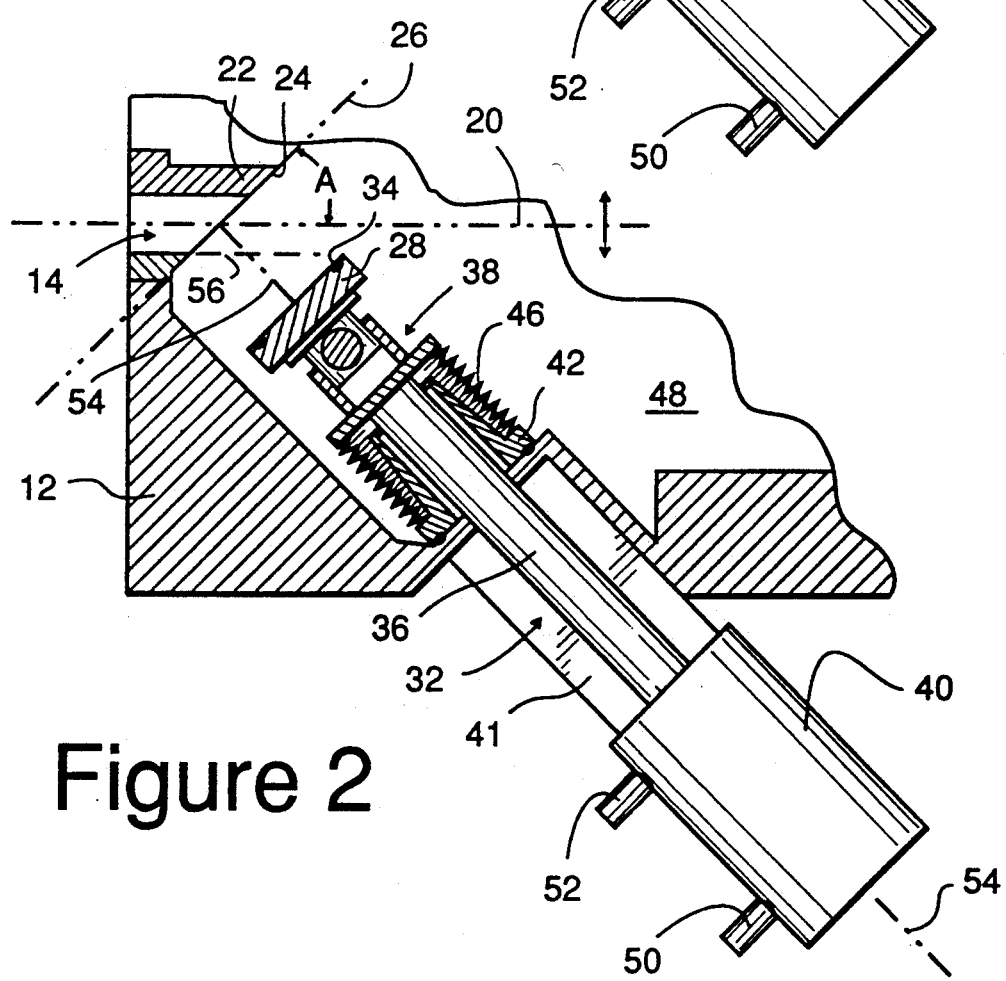
FIG. 2 is the same view as FIG. 1 with the slit valve in an open position.

In FIG. 2, air pressure has been applied to inlet 52 causing the door 28 to move linearly away from sealing plane 26 along an actuator axis 54 which is substantially perpendicular to the sealing plane 26. The shaft guide 42 serves as a stop to limit the motion of the shaft 36 towards the linear drive mechanism 40. The door 28 can be biased towards an open position, a closed position, or some intermediate position by an appropriate biasing mechanism (not shown).

It should be noted that all friction creating surfaces are isolated from the interior 48 of the chamber by the bellow sleeve 46. It is therefore very unlikely that the slit valve apparatus 10 will produce any particulates within the chamber interior 48, thereby eliminating a potential source of contamination. It should also be noted that the linear drive mechanism 40 delivers all of its force along actuator axis 54 perpendicularly to the valve seat 22. This not only reduces the amount of force which must be applied by the actuator mechanism 32, but it also minimizes rubbing between the O-ring 34 and the first seating surface 24, thereby reducing particulate generation and O-ring wear.

The angle A between the transfer plane 20 and the sealing plane 26 is preferably in the range of 30°-60° and is most preferably approximately 45°. If the angle A becomes much greater than about 60° the stroke of the shaft 36 must become very long to allow the door 28 to clear the bottom plane 56 of the aperture 14. If the angle A becomes much less than 30° the first seating surface 24 will become excessively large promoting possible leakage and requiring larger pressures to be exerted by the linear drive mechanism 40. An angle A of 45° is a good compromise between excessive stroke length of the shaft 36 and moderate closing pressure required of linear drive mechanism 40.

Figure 3:
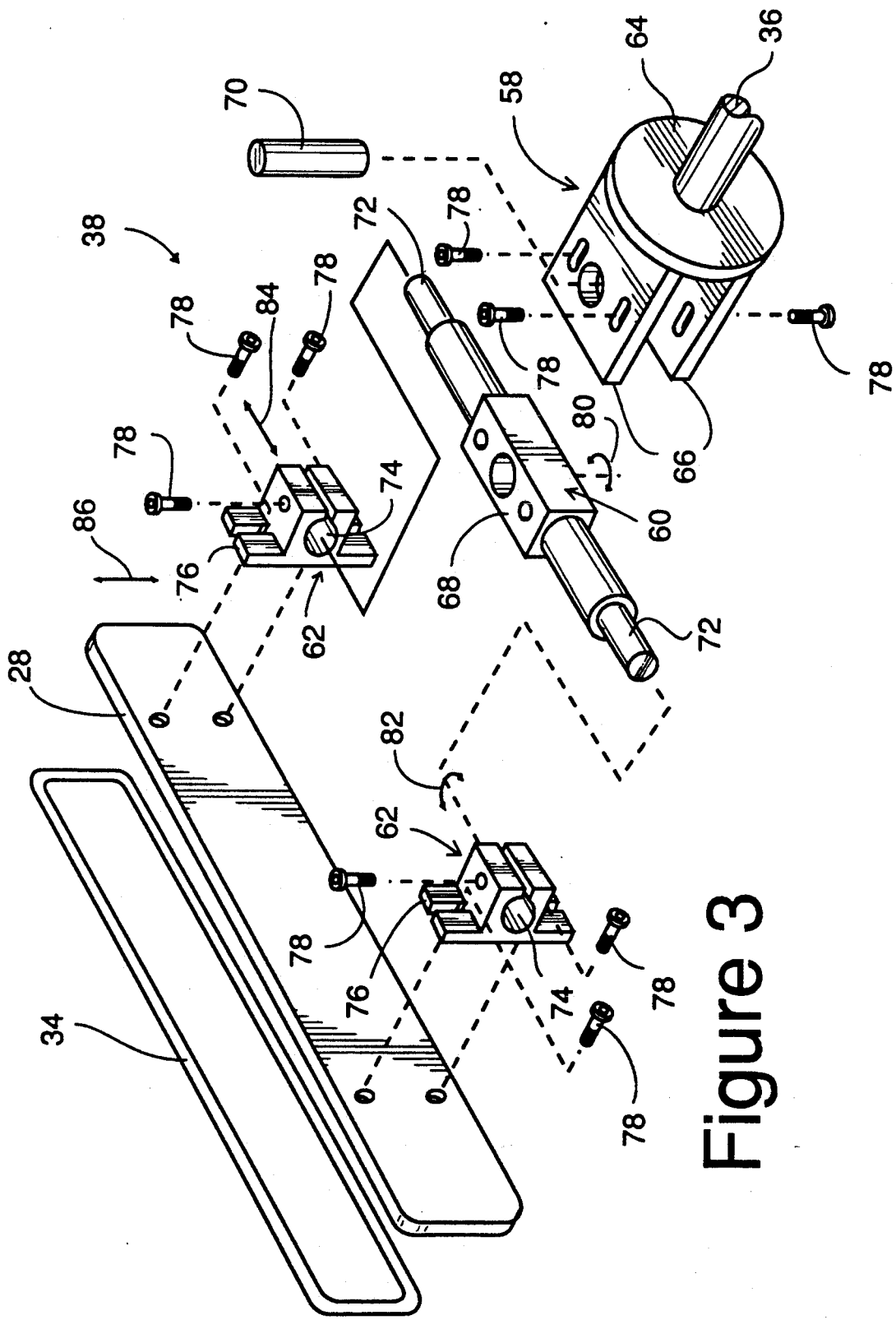
FIG. 3 is an exploded isometric view of the adjustable support for the valve door of the present invention.

In FIG. 3, an exploded isometric view of the adjustment mechanism 38 shows a bracket assembly 58, an axle 60 and a pair of axle bearings 62. A circular plate 64 of the bracket assembly is attached to shaft 36 and sealed to bellow sleeve 46 and a pair of fingers 66 engage a central portion 68 of axle 60 by means of a pivot pin 70. Bearing surfaces 72 of axle 60 engage bores 74 of the axle bearings 62. Ears 76 of the axle bearings 62 are attached to the door 28. A number of machine screws 78 create a locking mechanism for locking the position of the door 28 relative to shaft 36 and for holding the adjustment mechanism 38 together.

The adjustment mechanism 38 permits four separate adjustments to be made to the position of the door 28 relative to valve seat 22. A first adjustment 80 adjusts the left-right angular position of the door 28. A second adjustment 82 adjusts the up-down angular position of the door. A third adjustment 84 adjusts the left-right linear position of the door 28 relative the valve seat 22. Finally, a fourth adjustment 86 adjusts the up-down linear position of the door 28.

To properly adjust the door 28 to the valve seat 22, the screws 78 are loosened and the door 28 is closed by applying air pressure to inlet 50 of the linear drive mechanism 40. The angular adjustments 80 and 82 are made automatically by the pressing of the first seating surface 24 against the second seating surface 30 and the linear adjustments 84 and 86 are made manually, if necessary. Once the door 28 is properly positioned, the screws 78 are tightened to lock the door 28 into position. It should be noted that once the adjustment mechanism 38 is locked there are no moving parts to cause friction within the chamber interior 48.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A slit valve apparatus, comprising:
    wall means defining an elongated substantially rectangular aperture having a major axis and a minor axis, said aperture being adapted to pass a solid object along a transfer plane substantially parallel to said major axis and substantially perpendicular to said minor axis;
    elongated seat means surrounding said aperture, said seat means having a first seating surface defining a sealing plane which is angularly disposed with respect to said transfer plane;
    elongated door means having a second seating surface which is matingly engageable with said first seating surface parallel to said sealing plane; and
    linear actuator means for selectively moving said door means towards and away from said seat means along an actuator axis which is substantially perpendicular to said sealing plane.

2. A slit valve apparatus as recited in claim 1 wherein the included angle between said transfer plane and said sealing plane is in the range of 30°-60°.

3. A slit valve apparatus as recited in claim 2 wherein said included angle is about 45°.

4. A slit valve apparatus as recited in claim 1 wherein said linear actuator means includes an elongated shaft coupled at a first end to said door means and coupled at a second end to a reciprocal linear drive mechanism.

5. A slit valve apparatus as recited in claim 4 wherein said shaft passes through said wall means and further comprising guide means coupled to said wall means for guiding said shaft along said actuator axis and enclosure means coupling said first end of said shaft to said wall means.

6. A slit valve apparatus as recited in claim 4 wherein said reciprocal linear drive mechanism is pneumatically activated.

7. A slit valve apparatus as recited in claim 5 wherein said enclosure means comprises a bellows coupled at a first end to said shaft and coupled at a second end to said wall means.

8. A slit valve apparatus as recited in claim 7 further comprising elongated sealing means disposed between said first seating surface and said second seating surface.

9. A slit valve apparatus as recited in claim 1 wherein said seat means and said door means are elongated in a direction substantially parallel to said major axis.

10. A slit valve apparatus comprising:

wall means defining an elongated aperture having a major axis and a minor axis, said aperture being adapted to pass a solid object along a transfer plane substantially parallel to said major axis and perpendicular to said minor axis;

elongated seat means surrounding said aperture, said seat means having a first seating surface defining a sealing plane which is angularly disposed with respect to said transfer plane;

elongated door means having a second seating surface which is matingly engageable with said first seating surface parallel to said sealing plane, wherein said door means is substantially planar;

linear actuator means for selectively moving said door means towards and away from said seat means along an actuator axis which is substantially perpendicular to said sealing plane, said linear actuator means including an elongated shaft coupled at a first end to said door means and coupled at a second end to a reciprocal linear drive mechanism; and adjustable, lockable coupling means coupling said first end of said shaft to said door means such that the angular relationship between the plane of said door means and said actuator axis can be varied in more than one direction and then locked in position.

11. A method for selectively opening and closing an elongated substantially rectangular aperture provided in a wall through which solid objects may be passed substantially parallel to a transfer plane comprising the steps of:

opening said aperture by moving an elongated, substantially planar door means linearly away from said elongated aperture along an axis which is acutely angled relative to said transfer plane at least until said door means is clear of said transfer plane; and closing said aperture by moving said door means linearly towards an elongated aperture at least until said door means intersects said transfer plane and at least partially covers said aperture.

12. A method as recited in claim 11 wherein said elongated aperture has a major axis and a minor axis and wherein said transfer plane is substantially parallel to said major axis and substantially perpendicular to said minor axis.

13. A method as recited in claim 12 wherein said means is elongated in a direction substantially parallel to said major axis.

14. A method for selectively opening and closing an elongated aperture provided in a wall through which solid objects may be passed substantially parallel to a transfer plane comprising the steps of:

opening said aperture by moving an elongated, substantially planar door means linearly away from said elongated aperture along an axis which is acutely angled relative to said transfer plane at least until said door means is clear of said transfer plane;

closing said aperture by moving said door means linearly towards said elongated aperture at least until said door means intersects said transfer plane and at least partially covers said aperture; and adjusting and then locking the orientation of said door means relative to said axis such that said door means substantially covers said aperture after said step of closing said aperture.

15. A method for selectively opening and closing an elongated aperture as recited in claim 14 wherein said step of adjusting and then locking said orientation is accomplished by:

deactivating locking means which locks the position of said door means relative to said axis:

closing said aperture; and reactivating said locking means.

16. A method for selectively opening and closing an elongated aperture as recited in claim 11 wherein said acute angle is in the range of 30°–60°.

17. A method for selectively opening and closing an elongated aperture as recited in claim 16 wherein said acute angle is about 45°.

18. A slit valve apparatus, comprising:

wall means separating a first chamber from a second chamber, said wall means defining an elongated substantially rectangular aperture having a major axis and a minor axis, said aperture being adapted to pass a solid object along a transfer plane substantially parallel to said major axis and substantially perpendicular to said minor axis;

elongated seat means surrounding said aperture, said seat means having a first seating surface which is angularly disposed with respect to said transfer plane;

elongated door means having a second seating surface which is matingly engageable with said first seating surface; and linear actuator means for selectively moving said door means towards and away from said seat means along an actuator axis which is angularly disposed with respect to said transfer plane.

19. A method for selectively opening and closing an elongated substantially rectangular aperture provided in a wall which separates a first chamber from a second chamber, said aperture permitting the passage of a solid object from said first chamber to said second chamber along a transfer plane, said method comprising the steps of:

opening said aperture by moving an elongated door means linearly away from said elongated aperture along an axis which is acutely angled relative to said transfer plane at least until said door means is clear of said transfer plane; and closing said aperture by moving said door means linearly towards an elongated aperture until said door means intersects said transfer plane and at least partially covers said aperture.

20. A method for selectively opening and closing an elongated aperture as recited in claim 19 wherein said door means includes a locking means which locks the position of said door means, and further comprising the step of deactivating said locking means prior to closing said aperture.

21. A method for selectively opening and closing an elongated aperture as recited in claim 20 further comprising the step of reactivating said locking means after closing said aperture.

* * * * *